United States Patent [19]

Saito

[11] 4,095,195
[45] June 13, 1978

[54] LOW POWER DISSIPATION CRYSTAL OSCILLATOR
[75] Inventor: Takahito Saito, Tokyo, Japan
[73] Assignee: Kabushiki Kaisha Meidensha, Tokyo, Japan
[21] Appl. No.: 781,497
[22] Filed: Mar. 25, 1977
[51] Int. Cl.² ............................................. H03B 5/36
[52] U.S. Cl. ................................ 331/116 R; 58/23 A; 58/23 AC; 331/158
[58] Field of Search ................... 331/116 R, 158, 159; 58/23 R, 23 A, 23 AC

[56] References Cited
U.S. PATENT DOCUMENTS 3,887,881  6/1975  Hoffmann ................... 331/116 R X
3,956,714  5/1976  Lüscher ........................ 331/116 R
3,959,744  5/1976  O'Connor ..................... 331/116 R Primary Examiner—Siegfried H. Grimm
Attorney, Agent, or Firm—Haseltine, Lake & Waters

[57] ABSTRACT

A low power dissipation crystal oscillator which comprises an inverter circuit including a pair of complementary insulated gate field-effect transistors and an excitation circuit connected between the output and the input of the inverter circuit. The excitation circuit comprises a crystal resonator and a pair of capacitive loads, wherein different DC bias potentials are applied to the gates of the field-effect transistors, respectively, in order to cause the power dissipation to be extremely reduced.

12 Claims, 13 Drawing Figures

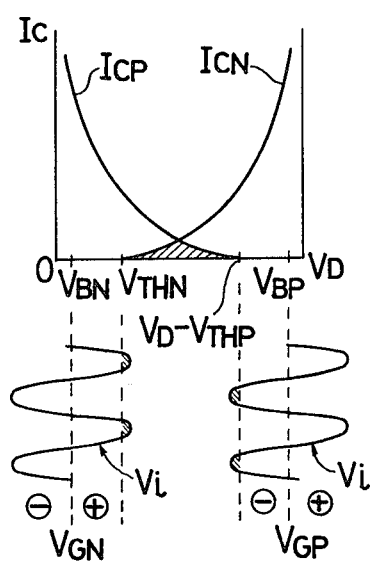
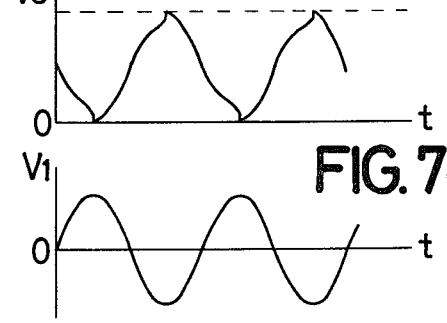
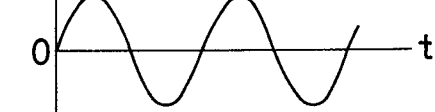
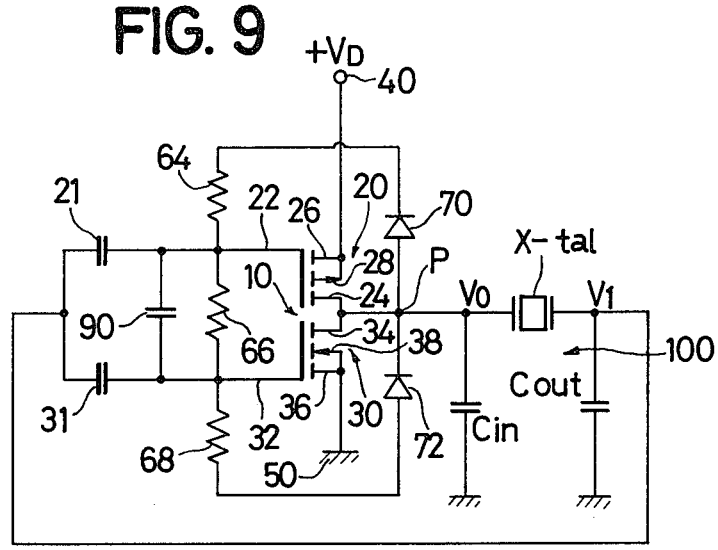

LOW POWER DISSIPATION CRYSTAL OSCILLATOR

BACKGROUND OF THE INVENTION

The present invention relates to a low power dissipation crystal oscillator, and more particularly to an oscillator employing complementary insulated gate (e.g. Metal-Oxide-Semiconductor) field-effect transistors (CMOS FET).

In general, a crystal oscillator used in a crystal watch essentially consists of an inverter circuit including CMOS FET and an excitation circuit including a crystal resonator. In operation, the feedback of the output of the CMOS inverter, provided that the bias point is set in a linear region of transfer characteristics of the CMOS inverter enables the crystal resonator to be excited. Using CMOS FETs in a crystal oscillator makes it possible to remarkably lessen power dissipation.

Power dissipation P is, in general, expressed by the following equation (1).

$$P = P_Q + P_{dyn} + P_s \qquad (1)$$

where $P_Q$ is power dissipation in a static condition due, for example, to leak current of usually negligible value, of the order magnitude of nA (nano amperes) at a normal temperature, $P_{dyn}$ is the power dissipation in an operational condition and is expressed by the following expression;

$$P_{dyn} \alpha C V_D^2 f_o$$

where C is a capacitive load, $V_D$ is a supply voltage, and $f_o$ is an oscillating frequency. Further, in the above eq. (1), $P_s$ is the power dissipation in a switching transition state. Although the value of $P_s$ is relatively small, it must take into account the power dissipation $P_s$ in a crystal oscillator used in a liner (unsaturated) region of the transfer characteristics of the CMOS inverter.

Improvements in high power batteries which have been assembled in crystal watches have proceeded rapidly. Batteries having 150 mAH, and a life of about two years have been obtained. However, it is impossible to completely guarantee for a long time the power dissipation in a crystal oscillator. For this reason, reduction of the power dissipation as shown in eq. (1) is greatly desired.

As a result of study and experiments on CMOS circuits, I have invented a novel crystal oscillator in which the power dissipation can be extremely reduced by respectively applying different DC bias potentials to each gate of CMOS FETs.

SUMMARY OF THE INVENTION

An object of the present invention is to provide a crystal oscillator in which power dissipation is extremely reduced.

Another object of the present invention is to provide a crystal oscillator which makes it possible to start oscillation at a low voltage.

Another object of the present invention is to provide a crystal oscillator having high oscillating frequency due to reduction of power dissipation, whereby its accuracy will be improved.

Another object of the present invention is to provide a crystal oscillator in which the time for inverter action in a linear region is minimized, whereby power dissipation is reduced.

Another object of the present invention is to provide a crystal oscillator suitable for a crystal watch the size of which is small and the performance of which is high.

One aspect of the present invention is as follows;

a crystal oscillator comprising an inverter circuit including a pair of complementary insulated gate field-effect transistors, and an excitation circuit connected between the output and the input of the inverter circuit, the excitation circuit including a crystal resonator and a pair of capacitive loads, wherein each different DC bias potential is respectively determined so that both field-effect transistors may conduct when no input signal is given, whereby the potential value of the power supply is reduced by one half of that of the prior art crystal oscillator and power dissipation is extremely reduced.

Another aspect of the present invention is as follows;

a crystal oscillator comprising an inverter circuit including a pair of complementary insulated gate field-effect transistors, and an excitation circuit connected between the output and the input of the inverter circuit, the excitation circuit including a crystal resonator and a pair of capacitive loads, wherein each different DC bias point is selected in such a manner that only when an input signal reaches the vicinity of its maximum positive-going swing the threshold level of the N-channel field-effect transistor, the N-channel insulated gate field-effect transistor conducts, while only when the input signal reaches the vicinity of its maximum negative-going swing the value obtained by subtracting the threshold level of the P-channel insulated gate-field transistor from the power supply voltage, the P-channel insulated gate field-effect transistor conducts, whereby power dissipation of crystal oscillator is extremely reduced.

BRIEF DESCRIPTION OF THE DRAWINGS

The features and advantages of a low power dissipation crystal oscillator according to the present invention will become more apparent from the following description taken in conjunction with the accompanying drawings, in which:

FIG. 7A is a wave form illustrating an input signal applied to the crystal oscillator shown in FIG. 6.

FIG. 7B is a wave form of a voltage produced across the capacitor $C_{in}$ shown in FIG. 6.

FIG. 7C is a wave form of the output of the crystal oscillator shown in FIG. 6.

FIG. 8 is a graph illustrating P-channel current and N-channel current as a function of the gate voltage and the manner of applying different bias potentials to each field-effect transistor.

FIG. 9 is a schematic circuit diagram adding a self-bias circuit to the circuit shown in FIG. 6.

In these drawings, the same numerals indicate the same or similar elements of the crystal oscillator of the present invention.

DETAILED DESCRIPTION OF PREFERRED EMBODIMENTS

Before proceeding with the description of the present invention, one form of conventional crystal oscillator including CMOS inverter device will be described for a better understanding of the present invention.

Figure 1:
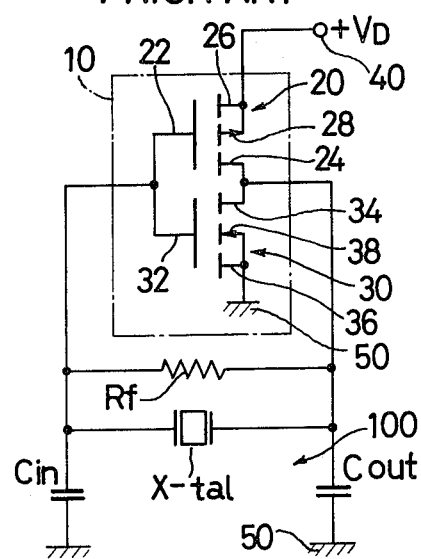
FIG. 1 is a schematic circuit diagram of a prior art crystal oscillator including a CMOS inverter circuit.

Referring to FIG. 1, reference numeral 10 is a CMOS inverter circuit comprising a complementary P-channel insulated gate field-effect transistor (P-MOS FET) 20 and an N-channel insulated gate field-effect transistor (N-MOS FET) 30. A gate 22 of the P-MOS FET 20 and a gate 32 of the N-MOS FET 30 are connected in common at the sides of the input of the inverter circuit 10. A drain contact 24 of the P-MOS FET 20 and a drain contact 34 are connected in common at the sides of the output of the inverter circuit 10. Both a source contact 26 and an auxiliary gate 28 of the P-MOS FET are connected to a terminal 40 of a DC power supply. Both a source contact 36 and an auxiliary gate 38 of the N-MOS FET are connected to ground 50. A feed back resistance $R_f$ is connected in parallel with the inverter circuit 10. An excitation circuit designated by reference numeral 100, is connected between the output and the input of the inverter circuit 10 and comprises a crystal resonator X-tal and a pair of capacitive loads $C_{in}$ and $C_{out}$, each of which is connected to the input terminal and the output terminal of the crystal resonator X-tal, respectively. Provided that the bias point is in a linear region of the transfer characteristics of the inverter 10, feedback from the output to the input of the CMOS inverter 10 causes the crystal resonator X-tal to be excited at a predetermined vibrational mode. In operation, in accordance with the change of an input signal $V_1$ applied to inverter circuit 10, P-MOS FET 20 and N-MOS FET 30 both conduct, respectively. More particularly, when the P-MOS FET turns on according to the variation of the input signal $V_i$, the N-MOS FET will turn off, whereby a channel current $I_{cp}$ of the P-MOS FET flows from power supply to ground 50 to charge the pair of capacitors $C_{in}$ and $C_{out}$ at a predetermined voltage. When the P-MOS FET 20 turns off according to the variation of the input signal $V_i$, the N-MOS FET 30 will turn on, whereby a discharge current flows through the crystal resonator X-tal. Thus, an AC power produced by charging or discharging the capacitive load $C_{out}$ causes the crystal resonator X-tal to be excited, whereby an oscillating circuit will be formed.

Figure 2:
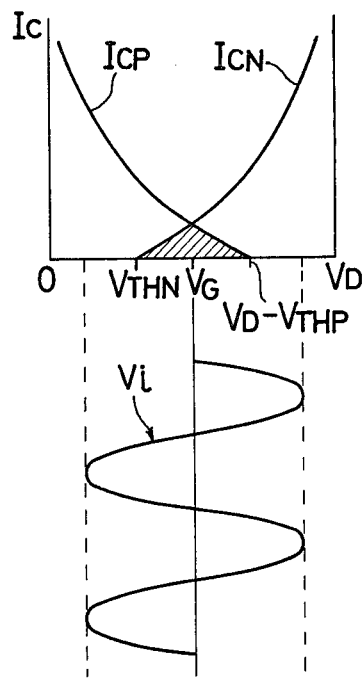
FIG. 2 is a graph illustrating N-channel current and P-channel current as a function of the gate voltage and the manner of setting of the bias point of an input signal shown in FIG. 1.

FIG. 2 is a graph illustrating the characteristic of the channel current as a function of the gate voltage. Reference numerals $I_{cp}$ and $I_{cn}$ are P-channel current and N-channel current, respectively. $V_{THP}$ and $V_{THN}$ are the threshold level of the P-MOS FET and the N-MOS FET, respectively. A biasing potential is selected so that its value is substantially one half of that of a supply voltage $V_D$.

In forming an oscillating circuit by use of a small input signal, it is to be noted that both the P-MOS FET and the N-MOS FET are placed into condition for conduction when no input signal is impressed on each gate of the MOS FETs. Accordingly, it is to be concluded that, in order to start the oscillation with the above circuit, the DC biasing voltage $V_G$ must be larger than the threshold level $V_{THN}$ of the N-MOS FET, and the difference between the supply voltage $V_D$ and the gate voltage $V_G$ is larger than the threshold level $V_{THP}$ of the P-MOS FET. That is to say, following equation must hold:

$$V_D > V_{THN} + V_{THP}$$

Therefore, it is necessary to set the supply voltage to a relatively large value, which will undesirably increase the power dissipation $P_s$ consumed in the crystal oscillator during switching action of the inverter. Furthermore, considering that $P_{dyn}$ is proportional to the square of the supply voltage $V_D$ as understood from eq. (1), an increase in power dissipation $P_{dyn}$ cannot be avoided. On the other hand, although the use of low supply voltage is desirable for small power dissipation, it is unable to start oscillation of the crystal oscillator unless the supply voltage is set so as to meet the above inequality $V_D > V_{THN} + V_{THP}$.

Another drawback of the prior art crystal oscillator is that the period in which current is flowing from the battery into the crystal oscillator is long since either of the MOS FETs in the CMOS inverter must be brought into conductive condition with respect to each cycle of an input signal. For this reason, much current is consumed, which increases the power dissipation. Moreover, a large amount of current flowing from the drain to the source is consumed since the conductive area in which both FETs conduct at a transition time is considerably wide. Therefore, it is not suitable for a crystal watch using a small battery whose power is about 190 mAH (mili ampere hour) to employ the aforementioned prior art crystal oscillator having large power dissipation.

With the above in mind, I have invented a novel crystal oscillator in which various deficiencies have been eliminated.

Figure 3:
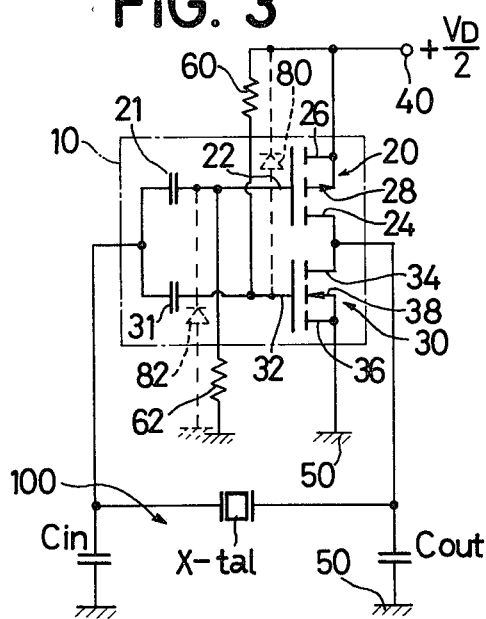
FIG. 3 is a schematic crystal oscillator including a pair of complementary field-effect transistors employed in a first embodiment of the present invention.

FIG. 3 is a schematic circuit diagram employed in the first embodiment of the present invention.

Referring to FIG. 3, the CMOS inverter 10 comprises complementary P-MOS FET 20 and N-MOS FET 30. A resistor 62 of high resistance value is connected between the gate 22 of the P-MOS FET and ground 50. A resistor 60 of high resistance value is connected between the gate 32 of the N-MOS FET and the terminal 40 of the DC power supply. Coupling capacitors 21 and 31 connect crystal resonator x-tal to respective gates of the P-MOS FET 20 and the N-MOS FET 30. The crystal resonator X-tal is connected between the output and the input of the inverter circuit 10. The capacitance loads $C_{in}$ and $C_{out}$ are connected between the input terminal and the output terminal of the inverter 10 and ground, respectively. Since the values of the resistances 60 and 62 are selected to be of the order of megohms, the gate biasing potential $V_{GP}$ of the P-MOS FET 20 is near the potential of ground 50 and the gate biasing potential $V_{GN}$ of the N-MOS FET 30 is near the potential of the power supply.

Figure 4:
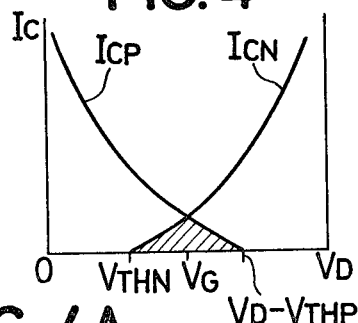
FIG. 4 is a graph illustrating N-channel current and P-channel current as a function of the gate voltage.
Figure 4A:
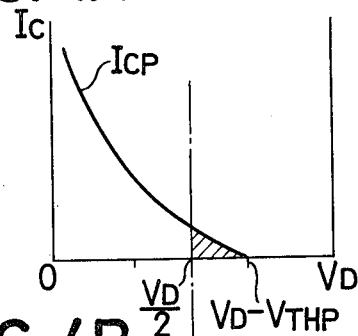
FIG. 4A is a graph illustrating the channel current flowing in a P-channel insulated gate field-effect transistor.

Referring to FIG. 4 illustrating channel current $I_c$ as a function of the biasing voltage, it is understood that, in the common gate biasing method as used in the prior art crystal oscillator, the condition $V_{THN} < V_G < V_D - V_{THP}$ is required for both FETs to be conductive when no input signal is impressed on each gate of the FETs. Analysis of FIG. 4 leads to the following discussion. If attention to respective channel current $I_{CP}$ and $I_{CN}$ of the FETs versus gate voltage is given, each characteristic of the P-channel current $I_{CP}$ and the N-channel current $I_{CN}$ is graphically shown in FIGS. 4A and 4B, respectively. With reference to FIG. 4A, it becomes apparent that a suitable bias voltage region in order for P-MOS FET to be conductive is between zero and $V_D - V_{THP}$.

Referring to the necessary conditions for the P-MOS FET to be conductive independently of the N-MOS FET, suitable biasing voltage region for the P-MOS FET is between $(V_D/2)$ and $V_D - V_{THP}$ when the biasing voltage $V_G$ is more than one half of supply voltage $V_D$. Hence, considering the level of $(V_D/2)$ as a reference point (zero level), the suitable biasing voltage region will lie between zero and $(V_D/2) - V_{THP}$. The instant supply voltage is reduced to one half of the initially supplied voltage $V_D$.

Figure 4B:
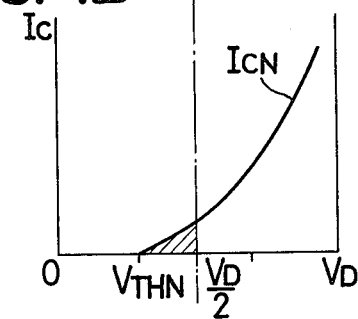
FIG. 4B is a graph illustrating the channel current flowing in a N-channel insulated gate field-effect transistor.

Likewise, referring to the necessary condition for N-MOS FET to be conductive independently of the P-MOS FET with reference to FIG. 4B, it becomes apparent that the suitable biasing voltage region is between $V_{THN}$ and $(V_D/2)$ when the biasing voltage $V_G$ is less than one half of the supply voltage $V_D$.

Figure 5:
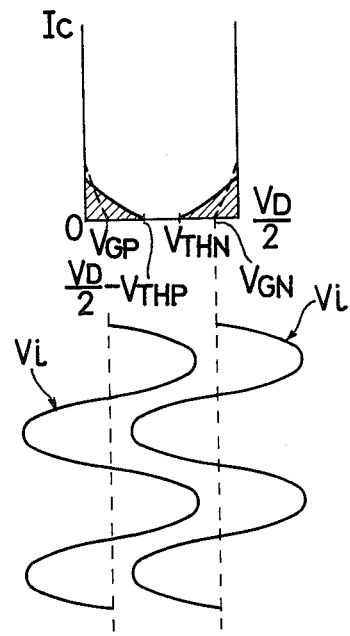
FIG. 5 is a graph illustrating the channel current as a function of the gate voltage and explaining how to give different bias potentials to each field-effect transistor.

The upper half of FIG. 5 graphically shows the combination of the FIG. 4B curve and a $V_D 1/2$ left-shifted FIG. 4A curve. When the gate voltage $V_{GP}$ of the P-MOS FET is between zero and $V_D/2 - V_{THP}$, and the gate voltage $V_{GN}$ of the N-MOS FET is between $V_{THN}$ and $V_D/2$, respectively, it is able to satisfy the condition for both MOS FETs to be conductive when no input signals are given, with the supply voltage being one half of the prior art one. Thus, the separation of the biasing voltage enables reduction of the supply voltage to one half. For this, the power dissipation $P_s$ is reduced.

Since the bias point is selected in such a manner that both FETs 20 and 30 conduct, provided that no input signal is given it is ready to be able to start oscillating.

When an input signal $V_i$ is supplied, $V_{GP} + V_i$ is impressed on the gate 22 of the P-MOS FET and $V_{GN} + V_i$ is impressed on the gate 32 of the N-MOS FET with the P-MOS FET and the N-MOS-FET, conductive respectively, load capacitor $C_{out}$ is repeatedly charged or discharged. The AC power produced by charging or discharging of the load capacitor $C_{out}$ excites the crystal resonator to cause it to oscillate. In the prior art crystal oscillator, there is a common conductive region as best shown in FIG. 2. Therefore, it is necessary for producing oscillation to completely feedback a charging or discharging current.

On the contrary, in this embodiment of the present invention there is no common conductive region of each MOS FET since the biasing voltage is separated through high resistances by connecting them between the gate 32 of the N-MOS FET 30 and the terminal 40 of the power supply, and between the gate 22 and the ground 50. Therefore, it is not necessary to completely feedback a charging or discharging current. For this reason, the power dissipation is reduced. Since the power supply voltage is reduced to substantially one half of the prior art crystal oscillator, the power dissipations $P_{dyn}$ is reduced to one fourth of the prior art crystal resonator. Furthermore, since a crystal resonator has, in general a very high Q-factor and a very low energy loss, the crystal oscillator is able to efficiently start oscillating even if the supplied power is reduced to one fourth of the prior art crystal oscillator.

Referring to a modification of the first embodiment of the present invention, a pair of diodes 80 and 82, as shown in FIG. 3 by broken line, are connected in parallel with the resistors 60 and 62, respectively. By adding the diodes 80 and 82 to the elementary circuit, an auto-bias circuit is formed. With the above circuit, P-channel current $I_{cp}$ and N-channel current $I_{CN}$ are graphically illustrated by the broken lines in FIG. 5, respectively, and thereby the conductive region is further decreased. Consequently, the power dissipation is further reduced.

As will be obvious from the foregoing description, the first embodiment of the crystal oscillator according to the present invention can provide following advantages:

a. Since different biasing voltages are impressed on each gate of the MOS FETs, the power supply voltage is reduced to one half of the prior art crystal oscillator. Therefore, the power dissipation $P_s$ and $P_Q$ are reduced to one half and the power dissipation $P_{dyn}$ is reduced to one fourth in comparison to the prior art crystal oscillator.

b. To obtain the advantage stated above, it is sufficient to connect a pair of high resistance resistors between the power supply and ground, respectively. Therefore, the cost of the crystal watch in which the crystal oscillator of the present invention is assembled is reduced.

c. Due to extremely low power dissipation in the crystal oscillator of the present invention, it is easy to expand the allowed frequency region, such as the $MH_z$ region. Thereby, a crystal oscillator with high accuracy will be easily obtained.

d. By adding the auto-bias circuit comprising the pair of diodes to the elementary circuit of the present invention, the total power dissipation can be further reduced.

Figure 6:
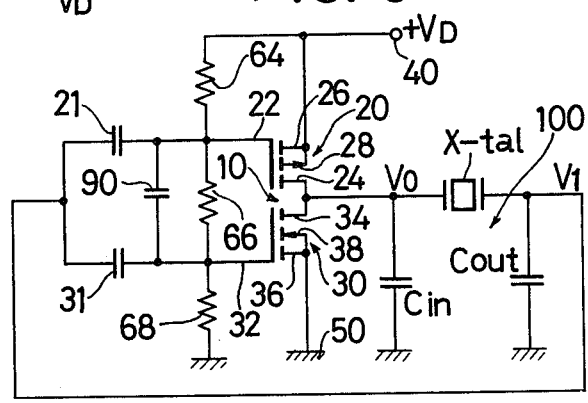
FIG. 6 is a schematic crystal oscillator including a pair of complementary field-effect transistors employed in a second embodiment of the present invention.

Next, a second embodiment of the crystal oscillator according to the present invention will be described. Referring to FIG. 6, reference numeral 64 is a resistor having a low resistance value, which is connected between the terminal 40 of the power supply and the gate 22 of the P-MOS FET 20. Reference numeral 66 is a resistor having high resistance value, which is connected between the gate 22 of the P-MOS FET 20 and the gate 32 of the N-MOS FET 30. Reference numeral 68 is a resistor having low resistance value, which is connected between the gate 32 of the N-MOS FET and ground 50. Reference numeral 90 is a bootstrap capacitor for starting oscillation, which is in parallel with the resistor 66. Reference is made to setting a bias point of this embodiment according to the present invention. As understood in FIG. 8, the biasing voltage $V_{BN}$ of the N-MOS FET 30 is selected in such a manner that only when the input signal is in the vicinity of its maximum positive-going swing slightly beyond the threshold level $V_{THN}$ of the N-MOS FET 30, the N-MOS FET 30 conducts. The wave form of the input signal $V_i$ is exaggeratedly illustrated in FIG. 8 for better understanding of this embodiment. However, in fact it is only necessary that the peak value of the input signal reaches the threshold level $V_{THN}$ of the N-MOS FET in order to conduct the N-MOS FET 30.

Similarly, the biasing voltage $V_{BP}$ of the P-MOS FET 20 is selected in such a manner that only when the input signal $V_i$ goes in the vicinity of its maximum negative-going swing slightly beyond the value obtained by subtracting the threshold level $V_{THP}$ of the P-MOS FET 20 from the power supply voltage $V_D$, the P-MOS FET 20 conducts. In this case, in fact it is only necessary that the peak value of the input signal $V_i$ reaches the value $V_D - V_{THP}$ in order to make the P-MOS FET conductive.

In operation, when the power supply is applied to the crystal oscillator, an oscillatory circuit including the capacitor 90 and the resistor 66 is formed. At an initial duration, both FETs are able to conduct by an oscillating current produced in the oscillatory circuit. That is, it is possible to start the CMOS inverter 10 in accordance with the switch shock by the initial application of the power supply. Reference is made to the requirements for the input signal shown in FIG. 7A. The input signal $V_i$ has the same frequency as the resonance frequency of the crystal resonator X-tal and the same amplitude of the gate voltage applied to both FETs. More particularly, the value of the capacitors $C_{in}$ and $C_{out}$ are determined in such a manner that the crystal resonator X-tal is able to oscillate under the supply voltage. Therefore, the input signal $V_i$ has in fact the same voltage amplitude as is produced across the capacitor $C_{out}$.

Hence, when such an input signal $V_i$ prescribed above is supplied to the input of the inverter circuit 10, the N-MOS FET 30 conducts for only a short time when the input signal goes in the vicinity of maximum positive going-swing slightly beyond its threshold level $V_{THN}$, and the P-MOS FET 20 conducts for only a short time when the input signal goes in the vicinity of maximum negative going-swing slightly beyond the value obtained by subtracting the threshold level $V_{THP}$ of the P-MOS FET 20 from the power supply voltage $V_D$. In accordance with the reciprocal conduction of the P-MOS FET 20 and the N-MOS FET 30, a pulse whose width is narrow is fed to the crystal resonator X-tal. When the pulse is impressed on the crystal resonator X-tal, an oscillating circuit which comprises the crystal resonator X-tal and the capacitors $C_{in}$ and $C_{out}$ is formed. A voltage whose wave form is shown in FIG. 7B is produced across the capacitor $C_{in}$ in accordance with the above oscillating current. In general, a wave form of an oscillating current is greatly distorted in its rise and fall. However, since the high Q-factor of the crystal resonator X-tal results in an infinitesimal attenuation of the oscillating current, wave distortion of the oscillating current flowing in the oscillating circuit which comprises the crystal resonator X-tal and capacitors $C_{in}$ and $C_{out}$, is substantially negligible. Therefore, the voltage $V_o$ produced across the capacitor $C_{in}$ has little wave distortion in its rise and fall, so that its wave form is substantially observed as a sine wave. The voltage $V_1$, as shown in FIG. 7C, produced across the capacitor $C_{out}$ has an antiphase of the voltage $V_o$, since the crystal resonator X-tal functions as an inductive load. That is, the voltage $V_1$ shown in FIG. 7C has the same phase as that of the input signal $V_i$ shown in FIG. 7A. Hence, feedback of the voltage $V_1$ to the input of the inverter 10 results in a preferable oscillating circuit.

Reference is now made to a modification of the second embodiment of the present invention. As best shown in FIG. 9, a self-biasing circuit comprising a pair of diodes 70 and 72 is further provided. The diode 70 is connected at the anode thereof to the output of the inverter circuit 10 and is connected at the cathode thereof to the gate 22 of the P-MOS FET 20 through the resistor 64. Likewise, the diode 72 is connected at the cathode thereof to the output of the inverter circuit 10 and is connected at the anode thereof to the gate 32 of the N-MOS FET 30 through the resistor 68. In operation, assuming that the P-MOS FET conducts, the voltage $V_P$ at a point designated by the reference numeral P is substantially the same as that of power supply voltage $V_D$. This voltage $V_P$ is partially fedback to the gate 22 of the P-MOS FET 20 through the resistor 64, so that the P-MOS FET 20 is greatly biased in the negative region of the input signal $V_i$. At the same time, the voltage $V_P$ is partially also fedback to the resistor 68, so that the gate 32 of the N-MOS FET 30 is greatly biased in the positive region. Therefore, when an input signal $V_i$ is supplied and reaches the threshold level $V_{THN}$ of the N-MOS FET 30, the N-MOS FET 30 instantaneously conducts. A similar operation in respect of the self-bias circuit repeatedly follows in accordance with the reciprocal conduction of the CMOS FET.

As understood from the foregoing description concerning the modification of the second embodiment, the biasing point is easily stabilized due to the self-bias circuit including the pair of diodes 70 and 72 and therefore, the wave form distortion of the oscillation is completely eliminated to obtain a desirable signal curve.

As will be obvious from the foregoing, the second embodiment of the crystal oscillator according to the present invention can provide the following advantages:

a. The biasing voltage $V_{BN}$ of the N-MOS FET is selected in such a manner that only when the input signal $V_i$ goes in the vicinity of its maximum positive going-swing slightly beyond the threshold level $V_{THN}$ of the N-MOS FET, will the N-MOS FET conduct. Likewise, the biasing voltage $V_{BP}$ of the P-MOS FET is selected in such a manner that only when the input signal $V_i$ goes in the vicinity of its maximum negative going-swing slightly beyond the value obtained by subtracting the threshold level of the P-MOS FET from the power supply voltage $V_D$ will the P-MOS FET conduct. Therefore, the conducting time of each MOS FET is very short, so that the power dissipation $P_{dyn}$ of the crystal oscillator is extremely reduced.

In fact, it is only necessary that the peak value of the input signal $V_i$ reaches the threshold $V_{THN}$ in order to make the N-MOS FET conductive. Similarly, it is only necessary that the peak value of the input signal $V_i$ reaches the value, $V_D - V_{THP}$ in order for the P-MOS FET to be conductive. For this reason, the actual power dissipation is further reduced.

b. The current which flows from the power supply to ground through the CMOS FETs in the switching action is the current which flows in the unsaturated region of the switching characteristic of the CMOS FETs. As best shown in FIG. 8, the biasing voltages applied to the gates of the CMOS FETs are selected as values sufficiently different to substantially prevent simultaneous conduction of the CMOS FETs. Accordingly, little current flows from the power supply to ground in the state of the oscillator operation. Thus, the power dissipation $P_s$ due to the current which flows in an unsaturated region of the CMOS FETs is extremely reduced.

c. Since the current consumed in each cycle of the input signal is very small, the influence of power dissipation with respect to oscillating frequency can be reduced to a great extent. For this reason, it will be possible to raise the allowed frequency of the crystal oscillator, which is at present limited to about 32 KHz, assembled in a crystal watch, so that a remarkable improvement in performance of the crystal watch can be obtained.

d. By adding the self-bias circuit including a pair of diodes to the elementary circuit of the second embodiment, the stability of the biasing point of the CMOS FET is further improved.

CONCLUSION

The crystal oscillator according to the present invention causes the power dissipation to be extremely reduced as best understood from Table described below, which shows the experimental comparison between the prior art crystal oscillator and the inventive oscillator.

Table

|  | Prior Art Crystal Oscillator | The first embodiment of the present invention | The second embodiment of the present invention |
| --- | --- | --- | --- |
| Oscillating frequency $f_o$ | 32.768 KH$_z$ | 32.768 KH$_z$ | 32.768 KH$_z$ |
| Supply voltage $V_D$ | 3.0 V | 1.5 V | 3.0 V |
| Channel current $I_c$ | 2.8 µA | 0.63 µA | 0.22 µA |
| Power dissipation P | 8.4 µW | 0.95 µW | 0.66 µW |

It is to be understood that modifications and variations of the embodiments of the invention disclosed herein may be resorted to without departing from the spirit of the invention and the scope of the appended claims.

What is claimed is:

1. A low power dissipation crystal oscillator comprising:
   an inverter circuit including a P-channel insulated gate field-effect transistor and a N-channel insulated gate field-effect transistor connected in series,
   a single power supply connected to said inverter circuit,
   an excitation circuit connected between an output and an input of said inverter circuit, said excitation circuit comprising a crystal resonator and a pair of capacitive loads connected between ground and an input and an output of said crystal resonator, respectively,
   means for applying different DC bias potentials to the gates of said field-effect transistors, respectively,
   said means comprising a first resistor of high resistance value connecting the power supply to the gate of said N-channel insulated gate field-effect transistor, and a second resistor of high resistance value connecting the gate of said P-channel insulated field-effect transistor to ground.

2. A low power dissipation crystal oscillator as defined in claim 1, which further comprises a pair of coupling capacitors connecting said crystal resonator to respective gates of said field-effect transistors.

3. A low power dissipation crystal oscillator as defined in claim 2, wherein an input signal is supplied to the inverter circuit as a feedback from the output of said excitation circuit, the values of said DC bias potentials being determined so that both field-effect transistors may conduct when no input signal is present, and the following inequality holds:

$$V_{GN} > V_{THN}, V_{GP} < V_D - V_{THP}$$

where $V_{GN}$ is the gate voltage of said N-channel field-effect transistor, $V_{GP}$ is the gate voltage of said P-channel field-effect transistor, $V_{THN}$ is the threshold level of said N-channel field-effect transistor, $V_{THP}$ is the threshold level of said P-channel field-effect transistor, and $V_D$ is the potential value of said power supply.

4. A low power dissipation crystal oscillator as defined in claim 3, which further comprises an auto-bias circuit including a diode connected in parallel with each said resistor.

5. A low power dissipation crystal oscillator as defined in claim 1, wherein an input signal is supplied to the inverter circuit as a feedback from the output of said excitation circuit, each different DC bias potential being respectively applied to each gate of both field-effect transistors in such a manner that only when the input signal reaches in the vicinity of its maximum positive-going swing the threshold level of said N-channel insulated gate field-effect transistor, will said N-channel insulated gate field-effect transistor be conductive, and only when said input signal reaches in the vicinity of its maximum negative-going swing the value obtained by subtracting the threshold level of said P-channel insulated gate field-effect transistor from the power supply voltage, will said P-channel insulated gate field-effect transistor be conductive.

6. A low power dissipation crystal oscillator comprising:
   an inverter circuit including a P-channel insulated gate field-effect transistor and a N-channel insulated gate field-effect transistor connected in series,
   a single power supply connected to said inverter circuit,
   an excitation circuit connected between an output and an input of said inverter circuit, said excitation circuit comprising a crystal resonator and a pair of capacitive loads connected between ground and an input and an output of said crystal resonator, respectively,
   means for applying different DC bias potentials to the gates of said field-effect transistors, respectively,
   said means comprising a first resistor of low resistance value connected between one terminal of said power supply and the gate of said P-channel insulated gate field-effect transistor, a second resistor of high resistance value connected between the gates of each of said field-effect transistors, and a third resistor of low resistance value connected between the gate of said N-channel field-effect transistor and ground.

7. A low power dissipation crystal oscillator as defined in claim 6 which further comprises a pair of coupling capacitors connecting said crystal resonator to respective gates of said field-effect transistors.

8. A low power dissipation crystal oscillator as defined in claim 6, which further comprises a bootstrap capacitor for starting oscillation of the crystal oscillator, said bootstrap capacitor being connected in parallel with said second resistor.

9. A low power dissipation crystal oscillator comprising:
   an inverter circuit including a P-channel insulated gate field-effect transistor and a N-channel insulated gate field-effect transistor connected in series, a single power supply connected to said inverter circuit, an excitation circuit connected between an output and an input of said inverter circuit, said excitation circuit comprising a crystal resonator and a pair of capacitive loads connected between ground and an input and an output of said crystal resonator, respectively, means for applying different DC bias potentials to the gates of said field-effect transistors, respectively, said means including a self-bias circuit comprising a pair of diodes wherein one of said diodes is connected at the anode thereof to the output of said inverter circuit and is connected at the cathode thereof to the gate of said P-channel insulated gate field-effect transistor through a first resistor of low resistance value, a second resistor of high resistance value connected between the gates of said field-effect transistors, said inverter circuit further comprising an oscillatory circuit including a bootstrap capacitor for starting oscillation of the crystal oscillator connected in parallel with said second resistor, the other of said diodes being connected at the cathode thereof to the output of said inverter circuit and being connected at the anode thereof to the gate of said N-channel insulated gate field-effect transistor through a third resistor of low resistance value.

10. A low power crystal oscillator as defined in claim 9, wherein an input signal is supplied to the inverter circuit as a feedback from the output of said excitation circuit, each different DC bias potential being respectively applied to each gate of both field-effect transistors in such a manner that only when the input signal goes in the vicinity of its maximum positive-going swing slightly beyond the threshold level of said N-channel insulated gate field-effect transistor, will said N-channel field-effect transistor be conductive, and only when said input signal goes in the vicinity of its maximum negative-going swing slightly beyond the value obtained by subtracting the threshold level of said P-channel insulated gate field-effect transistor from the power supply voltage, will said P-channel insulated gate field-effect transistor be conductive.

11. A low power dissipation crystal oscillator as defined in claim 10, wherein the frequency of said input signal is the same as the resonance frequency of said crystal resonator, and the amplitude of said input signal is the same as that of the voltage applied to both said field-effect transistors.

12. A low power dissipation crystal oscillator as defined in claim 11 which further comprises a pair of coupling capacitors connecting said crystal resonator to respective gates of said field-effect transistors.

* * * * *